(12) United States Patent
Sarkar et al.

(10) Patent No.: US 11,508,573 B2
(45) Date of Patent: Nov. 22, 2022

(54) PLASMA DOPING OF GAP FILL MATERIALS

(71) Applicant: Micron Technology, Inc., Boise, ID (US)

(72) Inventors: Santanu Sarkar, Boise, ID (US); Jay Steven Brown, Boise, ID (US); Shu Qin, Boise, ID (US); Yongjun Jeff Hu, Boise, ID (US); Farrell Martin Good, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 15/930,875

(22) Filed: May 13, 2020

(65) Prior Publication Data
US 2021/0202243 A1 Jul. 1, 2021

Related U.S. Application Data

(60) Provisional application No. 62/955,814, filed on Dec. 31, 2019.

(51) Int. Cl.
*H01L 21/02* (2006.01)
*H01L 21/3105* (2006.01)
*H01L 27/24* (2006.01)

(52) U.S. Cl.
CPC .... *H01L 21/02282* (2013.01); *H01L 21/0234* (2013.01); *H01L 21/02129* (2013.01); *H01L 21/31053* (2013.01); *H01L 27/2481* (2013.01)

(58) Field of Classification Search
None
See application file for complete search history.

(56) References Cited

U.S. PATENT DOCUMENTS

| | | | | |
|---|---|---|---|---|
| 7,381,662 B1* | 6/2008 | Niu | .................. | H01L 21/02348 438/795 |
| 2004/0102032 A1* | 5/2004 | Kloster | ............. | H01L 21/02118 438/623 |
| 2005/0067702 A1* | 3/2005 | America | ........... | H01L 21/02304 257/753 |
| 2006/0128167 A1* | 6/2006 | Nakata | ................ | H01L 21/0234 438/795 |
| 2006/0154492 A1* | 7/2006 | Ide | .................... | H01L 21/02203 438/781 |
| 2007/0151956 A1* | 7/2007 | Iino | ................... | H01L 21/31138 257/E21.256 |

(Continued)

*Primary Examiner* — Erik Kielin
(74) *Attorney, Agent, or Firm* — Schwegman Lundberg & Woessner, P.A.

(57) ABSTRACT

In a variety of processes for forming electronic devices that use spin-on dielectric materials, properties of the spin-on dielectric materials can be enhanced by curing these materials using plasma doping. For example, hardness and Young's modulus can be increased for the cured material. Other properties may be enhanced. The plasma doping to cure the spin-on dielectric materials uses a mechanism that is a combination of plasma ion implant and high energy radiation associated with the species ionized. In addition, physical properties of the spin-on dielectric materials can be modified along a length of the spin-on dielectric materials by selection of an implant energy and dopant dose for the particular dopant used, corresponding to a selection variation with respect to length.

30 Claims, 10 Drawing Sheets

(56) References Cited

U.S. PATENT DOCUMENTS

| | | | |
|---|---|---|---|
| 2009/0072401 A1* | 3/2009 | Arnold | H01L 21/76826 257/751 |
| 2012/0190213 A1* | 7/2012 | Qin | H01L 21/31155 438/783 |
| 2019/0088871 A1* | 3/2019 | Kim | H01L 27/2409 |
| 2019/0165099 A1* | 5/2019 | Chen | H01L 29/66795 |

* cited by examiner

| GROUPING | IMPLANT TOOL | IMPLANT SPECIES | HARDNESS (Gpa) | YOUNG'S MODULUS (Gpa) |
|---|---|---|---|---|
| FURNACE ONLY | NONE | NONE | 0.39 ± 0.01 | 6.80 ± 0.20 |
| H Impl | PLAD | HH5K5E16 | 4.75 ± 0.25 | 35.8 ± 1.3 |
| He Impl | PLAD | HEE8K5E16 | 8.88 ± 0.22 | 71.3 ± 1.3 |
| TMAH+He Impl | PLAD | HEE8K5E16 | 9.23 ± 0.38 | 75.0 ± 3.1 |
| UV+He Impl | PLAD | HEE8K5E16 | 8.93 ± 0.32 | 72.6 ± 2.5 |
| N Impl | PLAD | NN10K5E16 | 2.92 ± 0.06 | 25.8 ± 0.5 |
| F Impl | BL | F8K3E15 | 1.43 ± 0.03 | 13.0 ± 0.3 |
| C Impl | BL | C7500V1E16 | 1.69 ± 0.04 | 15.9 ± 0.3 |
| Ge Impl | BL | GE10K15E15 | 0.55 ± 0.01 | 6.80 ± 0.10 |
| B2H6 Impl | PLAD | BH10K5E16 | 7.18 ± 0.15 | 56.4 ± 1.0 |
| BF3 Impl | PLAD | BFF10K5E16 | 2.26 ± 0.08 | 19.1 ± 0.6 |

FIG. 6

| GROUPING | IMPLANT ENERGY (eV) | PROCESS TIME (MIN/WFR) | He PLAD RECIPES | HARDNESS (Gpa) | YOUNG'S MODULUS (Gpa) | Hg-PROBE I-V, C-V $J_{LEAKAGE}$ (A/cm²) AT 3MV/CM | $V_{DB}$ (V) | k | DRY ETCHING RATE (Å/SEC) | SHRINKAGE (%) |
|---|---|---|---|---|---|---|---|---|---|---|
| FURNACE ONLY | NONE | TOTAL>4HRS >3MIN/WFR | NONE | 0.25 (0.35) | 6.1 (10.1) | 2.4E-08 | 106.9 | 3.1 | 35.0 | NA |
| UV BKM TREATMENT | NONE | 4 | NONE | 0.63 (0.96) | 7.5 (17.7) | 1.5E-08 | 106.1 | 3.2 | 29.1 | 1.3 |
| He PLAD | HIGH E 8keV | 1 | HEE8K60SEC | 6.54 (6.38) | 63.0 (85.6) | 2.8E-03 | 16.6 | 3.0 | ~0 | 29.6 |
| He PLAD | LOW E 1keV | 1 | HEE1K60SEC | 0.45 (1.17) | 6.6 (24.8) | 5.3E-08 | 168 | 3.0 | 15.4 | 13.3 |
| He PLAD | VLE 500eV | 1 | HEE500V60SEC | 0.35 (0.77) | 5.6 (14.2) | 2.0E-08 | 175 | 2.9 | 21.1 | 7.8 |
| He PLAD | ULE 250eV | 1 | HEE250V60SEC | 0.33 (0.69) | 5.4 (13.4) | 1.3E-08 | 103 | 2.8 | 24.8 | 4.3 |
| He PLAD | ULE 100eV | 1 | HEE100V60SEC | 0.37 (0.80) | 5.8 (14.9) | 3.2E-08 | 102 | 2.9 | 22.1 | 2.9 |

| | He IMPLANT @ He PLAD | | | | FINAL THK, $t_{XRR}$ | POST-IMPLANT XXR DENSITY (g/cm³) POR, ρ = 1.3 g/cm³ | | |
|---|---|---|---|---|---|---|---|---|
| | ENERGY | DOSE | TIME | PRESSURE | | SURFACE (0-1nm) | SiOC (1-4nm) | BULK SiOC |
| G1 | 8 keV | 5E16 | 60s | 4MT | 1453A | 1.1 (<POR) | 2.8 | 1.8 |
| G2 | 8 keV | 1E16 | 12s | 4MT | 1636A | 1.1 (<POR) | 2.6 | 1.7 |
| G3 | 100 eV | 5E16 | 60s | 4MT | 1944A | 1.3 (<POR) | 2.9 | 1.3 (=POR) |
| G4 | 100 eV | 1E16 | 12s | 4MT | 1959A | 2.0 | 2.8 | 1.3 |
| G5 | 100 eV | 5E16 | 60s | 10MT | 1947A | 1.7 | 2.6 | 1.3 |
| G6 | 500 eV | 1E16 | 60s | 4MT | 1916A | 1.8 | 2.9 | 1.4 |
| G7 | 250 eV | 1E16 | 60s | 4MT | 1923A | 2.3 | 1.9 | 1.3 |

BORDERLINE: G1, G2
SURFACE DENSIFIED: G3–G7
BULK DENSIFIED: G1, G2
BULK NON-DENSIFIED: G3–G7

PLASMA DOPING OF GAP FILL MATERIALS

PRIORITY APPLICATION

This application claims the benefit of priority to U.S. Provisional Application Ser. No. 62/955,814, filed Dec. 31, 2019, which is incorporated herein by reference in its entirety.

FIELD OF THE DISCLOSURE

Embodiments of the disclosure relate generally to fabrication of electronic devices and fabricated electronic devices, and more specifically, to electronic devices and formation of electronic devices using plasma doping.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three dimensional (3D) XPoint™ memory, among others. A 3D X-Point memory is a non-volatile memory (NVM) technology with a stackable cross-grid data access array in which bit storage is based on a change of bulk resistance.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

BRIEF DESCRIPTION OF THE DRAWINGS

The drawings, which are not necessarily drawn to scale, illustrate generally, by way of example, but not by way of limitation, various embodiments discussed in the present document.

FIG. 6 shows a table of experimental results of curing a C-SOD using conventional approaches and different PLAD approaches, according to various embodiments.

FIG. 7 shows a table of experimental results of curing a C-SOD using conventional approaches and different PLAD approaches, according to various embodiments.

FIG. 8 shows a table of density profiles from X-ray reflectometry (XRR) measurements on SiOC SODs, according to various embodiments.

DETAILED DESCRIPTION

Figure 1:
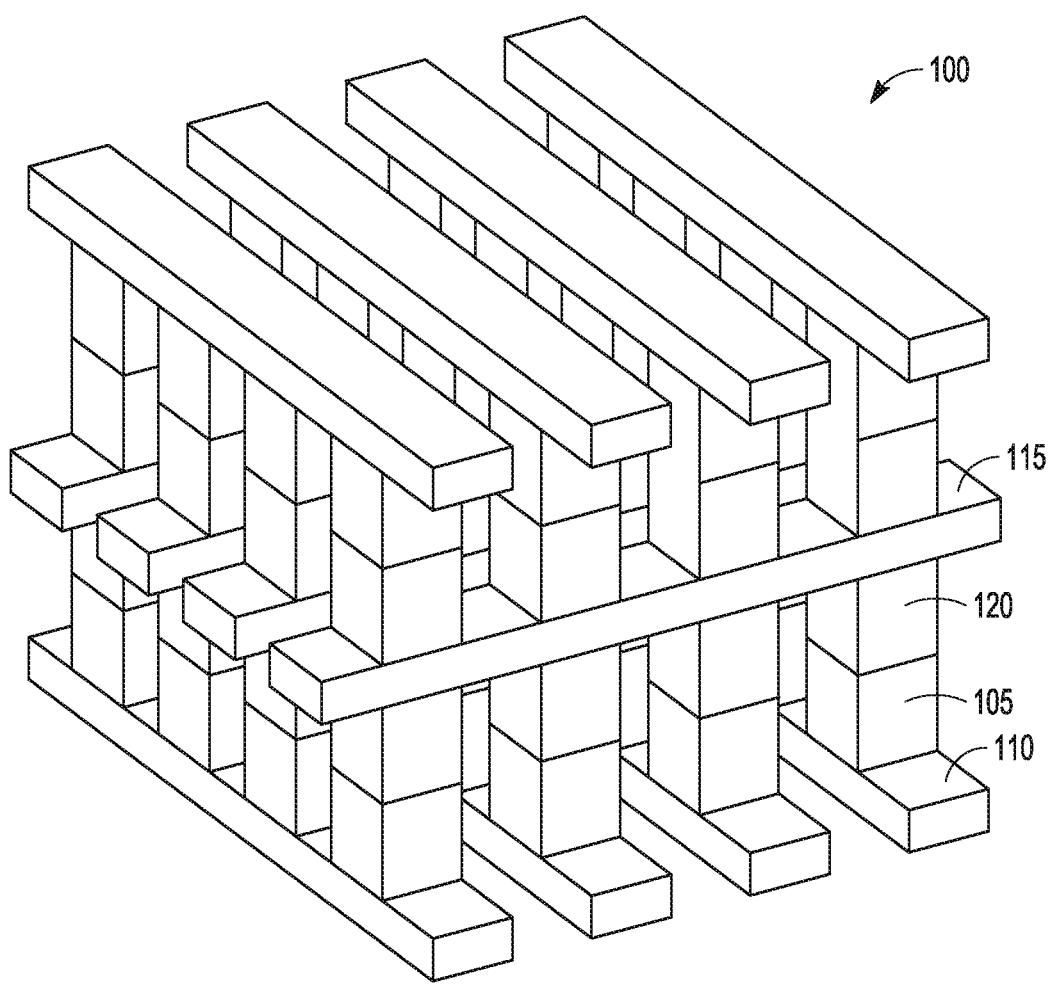
FIG. 1 is a block diagram representing an arrangement of a vertical 3D stack of a X-Point memory device, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Spin-on deposition in electronic device fabrication is a process of applying material to a wafer, where the material is originally dispensed on the wafer in liquid form and the wafer is rotated for uniform distribution of the material and the material is then solidified by low temperature (for example <200° C.) bake. Spin-on materials are used as dielectric gap fill for narrow and high aspect ratio trench fill in both shallow trench isolation (STI) and pre-metal dielectric applications in electronic devices for their good gap-fil properties. For example, in a number of three-dimensional (3D) memories, there are columns of selectable memory cells, where, in fabrication there are gaps between the columns electrically isolating various of the columns, though in some architectures conductive plate-like structures can connect portions of some of the columns, based on the respective architecture. The gaps are filled with dielectric material, where this dielectric material is referred to as dielectric gap fill or gap fill. Spin-on dielectrics (SODs) for gap-fil can include material such as such as silicates, siloxanes, silazanes or silisequioxanes. SODs also include spin-on glasses (SOG) and spin-on dielectric polymers. For example, cross-point (X-Point) memory components have used carbon-rich spin-on dielectric (C-SOD) films to fill gaps between stacks at access lines, WL, such as wordlines and at data lines, BL, such as bitlines, to eliminate voids for better filling. Such C-SOD films can provide sufficient density at low temperatures. For purposes of the present description, low carbon (C atomic %) SODs are those having 10-30% C content and carbon-rich SODs are those having 30-60% C content. Content is by atomic percent, where C % is atomic percent of carbon content, which can be detected by X-ray photoelectron spectroscopy (XPS). For example, in a SiOC composition the atomic precent of C. Si and O adds up to a total of 100%.

One organic low-k dielectric C-SOD material for X-Point WL or BL trench fill includes $SiO_x$ plus approximately 50% carbon (C) plus pores (a silsesquioxane derivative). A low-k dielectric is a dielectric having a dielectric constant lower than that of $SiO_2$ (k<3.9) and a high-k dielectric is a dielectric having a dielectric constant greater than that of $SiO_2$ (k>3.9). Organic SOD (C-based) can have k-values ranging from 2.65 to 3.1, while C-less inorganic SOD has k-values ranging from 5.6 to 7.9. C-SOD films can differ by percentage of carbon, stoichiometry of silicon oxide, and pores.

Additionally, SOD fill materials have exhibited tunable thermal conductivity, with such thermal conductivity being approximately 0.14 $Wm^{-1}K^{-1}$ versus 1.3 $Wm^{-1}K^{-1}$ for $SiO_2$. In comparison to conventional $SiO_x$ fill, for example tetraethyl orthosilicate (TEOS), this relatively low thermal conductivity of SOD fill materials has provided decreased thermal disturb (TD) issues during cell operations by providing a balanced thermal barrier among the nearest neighbor cells. The tunability can be provided by the select of materials and processing parameters.

However, as-deposited or thermally cured SOD (e.g. C-SOD with approximately 50% carbon along with $SiO_x$ with x>1) often presents integration challenges in chemical mechanical polishing (CMP) and etching in device processing. The challenges include weak mechanical strength with a modulus of approximately 6 GPa. Adhesive and cohesive failure, such as CMP rip-outs have been observed (rip-outs are materials, which can include sharply pointed geometries, that break off during the CMP process). Further, as-deposited or thermally cured SOD are typically susceptible to chemical attack and have poor selectivity with respect to carbon, which makes it susceptible to post-processing, for example post-processing that leads to porous material. Curing is a process during which a chemical reaction, such as polymerization, or a physical action, such as evaporation, occurs that results in a harder, tougher or more stable linkage (or substance). In polymer chemistry and process engineering, curing is a chemical process that produces the toughening or hardening of a polymer material by cross-linking of polymer chains. A cross-link is a bond that links a polymer chain to another polymer chain. In addition, there have been massive or immediate adhesion failures during CMP with a C-SOD stack treated with tetramethylammonium hydroxide (TMAH).

Another challenge is alignment mark damage at CMP. An underfill issue is more severe with post C-SOD fill to alignment marks due to topography. C-SOD fill can be below alignment marks has for array height. Alignment mark topography for feature width causes C-SOD underfill. Underfill is worse for TMAH treated and ultraviolet (UV) treated C-SOD films.

Besides process issues, C-SOD films are often thought as the root causes for reduced cell programing window and degraded performance. Hydrogen (H), moisture, or steam poisoning on a phase-change (PM) region is believed a mechanism for these process issues. As one example, a PM region, which can be implemented as a chalcogenide-based phase-change region, can be arranged as a memory element of a phase-change memory (PCM) device; and other memory storage technologies, such as variable resistance memory technologies can have memory elements (sometimes again comprising a chalcogenide material), can be subject to such damage or degradation.

Mitigation of integration issues can be attainted with improvement of C-SOD physical stability, including mechanical strength and adhesion, and chemical stability, including dry or wet etch properties. In a current furnace cure at 200° C. for two hours in a $N_2$ environment, the total process time can be greater than 4 hrs. with a greater than 3 min/wafer processing rate. This furnace cure can provide for appropriate cross linking with $H_2O$ removal (dehydration). However, this cure has resulted in material with insufficient mechanical strength, with Young's modulus of 6 GPa. In addition, the furnace cure has a low throughput (T-put) and high cost. In contrast, in a best known method for ultraviolet (UV) cure under non-oxidizing and oxidizing conditions, a process time of 4 min/wafer was attained. The UV cure provide enhanced cross linking with improved mechanical strength to a Young's modulus of approximately 7.5 GPa. Still, this can be insufficient mechanical strength. The UV cure has a low T-put and high cost of tool sets.

In various embodiments, a method is provided for enhancing mechanical properties and selective densification of organosilicate SOD materials by a plasma doping (PLAD) process. As examples, the SOD materials can be formed as array gap fill materials, though other applications are contemplated. The selective densification can be attained as a selectivity of surface vs bulk densification. The PLAD process is an implant process that differs from conventional beam-line implantation. Curing of SOG or SOD material by implanting, in a post-coat or bake processing, can improve its mechanical strength and modulate its chemical composition, providing a balanced Si/C/O ratio. The mechanical strength can be exhibited by its Young's modulus (E) and hardness (H). Improving mechanical strength and balancing of the ratio of constituents can provide for successful integration of a SOD gap fill in any memory device with respect to mitigating process related challenges such as CMP and etching. In addition, improving mechanical strength and balancing of the ratio of constituents can recover cycling performance of device cell, providing enhanced reliability or endurance, improving PM film quality and endurance by removing hydrides.

A PLAD process, as taught herein, can provide a high throughput, low cost, low temperature, such as room temperature (RT), treatment, and can be used to cure C-SOD films by a mechanism of a combination of plasma ion implant and high energy radiation associated with the species of ion dopant used. Such a method using a PLAD process provides a novel way of crosslinking of C-SOD films to improve mechanical, electrical, and chemical properties. Selective modification of surface vs bulk can be implemented by tuning implant energy and ion density in the PLAD process.

Helium (He) can be used as the implant in a PLAD process to cure SOD films. Using a He plasma provides processing with soft x-ray radiation. Extended ultraviolet (EUV) radiation spectrum provides much higher photon energy 40.81 eV (for He II) and 21.22 eV (for He I) than regular UV radiation and photon energies of other plasmas that are less than 10 eV. He I and He II refer to two different ionization states of He. The use of the higher photon energies significantly improve C-SOD and cell film properties. At the same time, in-situ He plasma low energy ion bombardments enhance C-SOD curing and further improves C-SOD film properties.

Curing of a C-SOD by PLAD shows significant C-SOD improvements that include much higher near surface mechanical strength (hardness and Young's modulus), tunable electrical properties, and enhanced chemical and thermal stabilities with smaller volume shrinkage. Based on these property improvements, the current issues of CMP and dry etch processes are minimized and much improved.

Curing of SOD by He PLAD can facilitate H removal by high energy radiation to improve cell reliability/endurance. Such PLAD processing can provide a significantly higher T-put and low cost because the associated process time is only 1 minute compared with greater than three minutes to hours using convenient procedures. Curing by PLAD is not limited to helium implant, but also applies to other PLAD implants involving. H, nitrogen (N), boron (B), diborane ($B_2H_6$), fluoride (F), boron trifluoride ($BF_3$), C, germanium (Ge) etc. as demonstrated in Table 640 of FIG. 6.

Curing of SOD by PLAD, as taught herein, is not limited to one type of SOD, for example C-SOD, but is applicable to other SOD materials, including SOG materials and polymers used in shallow trench isolation (STI) gap fill. These materials include, for example, but are not limited to, organic SOD with varying carbon content, by atomic percent, from approximately 10% to 60% and photo-imageable SOD. SODs cured by PLAD are applicable to DRAM structures with low-k SOD fill and NAND large area gap (LAG) fill films, including photo definable UV sensitive gap fills.

PLAD curing of SOD can be applied prior or post CMP planarization of the SOD according to an integration flow in the integrated circuit fabrication. The PLAD can be implemented without any additional integration changes or architecture changes in the processing. PLAD processing of SOD gap fill materials can be performed as a low-temperature process that makes the integration feasibility in low thermal budget memory devices. Further, a PLAD process of SOD gap fill materials is tunable by ion density (dose), bias energy and exposure time. The tunable process can include selection of dose, bias energy, or exposure time to modify a physical property of the formed SOD gap fill material. The selection can be made according to a functional or table relationship of process parameters to physical properties of SOD gap fill material with respect to a length of SOD gap fill material formed.

FIG. 1 is a block diagram representing an arrangement 100 of a vertical 3D stack of a X-Point memory device. The X-Point memory device is non-volatile memory with relatively high endurance, since it is not significantly impacted by the number of write cycles performed. The X-Point memory device has a number of columns of thin regions of memory in which the thin regions are stacked to provide increased density of memory cells. Arrangement 100 has a cross-point structure having perpendicular electrodes connecting submicroscopic columns. An individual memory cell 105 can be addressed by selecting a top electrode 115 and a bottom electrode 110 coupled to the individual memory cell 105. As shown in FIG. 1, top electrode 115 is an electrode coupled to more than one memory cell, with these memory cells coupled to different bottom electrodes. Thus, each memory cell can be addressed by activating one assigned top electrode and one assigned bottom electrode. Each memory cell can store a single bit of data. Arrangement 100 shows columns of two memory cells in a stack with top electrodes, like top electrode 115, of memory cells being a bottom electrode to the memory cell at the top of the stack of two memory cells.

Each memory cell, such as memory cell 105, can be coupled to one of its assigned electrodes via a selector 120. The selector 120 can be implemented without a transistor to enable its associated memory cell to be written to or read. The selector 120 can be arranged as an ovonic threshold switch (OTS). An OTS is a two-terminal symmetrical voltage sensitive switching device. An OTC can be implemented as a glass switch that, after transitioning from a relatively high resistive state to a conducting state, returns to the relatively high resistive state in response to current, through the switch, falling below a holding current value.

In arrangement 100, there are gaps between the columns of stacked memory cells, which gaps are presented for ease of discussion. During the fabrication process, these gaps can be filled with dielectric gap fill using a SOD. A number of SODs can be used including, but is not limited to, a SOG. The SOD can be a PLAD cured SOD.

Figure 2:
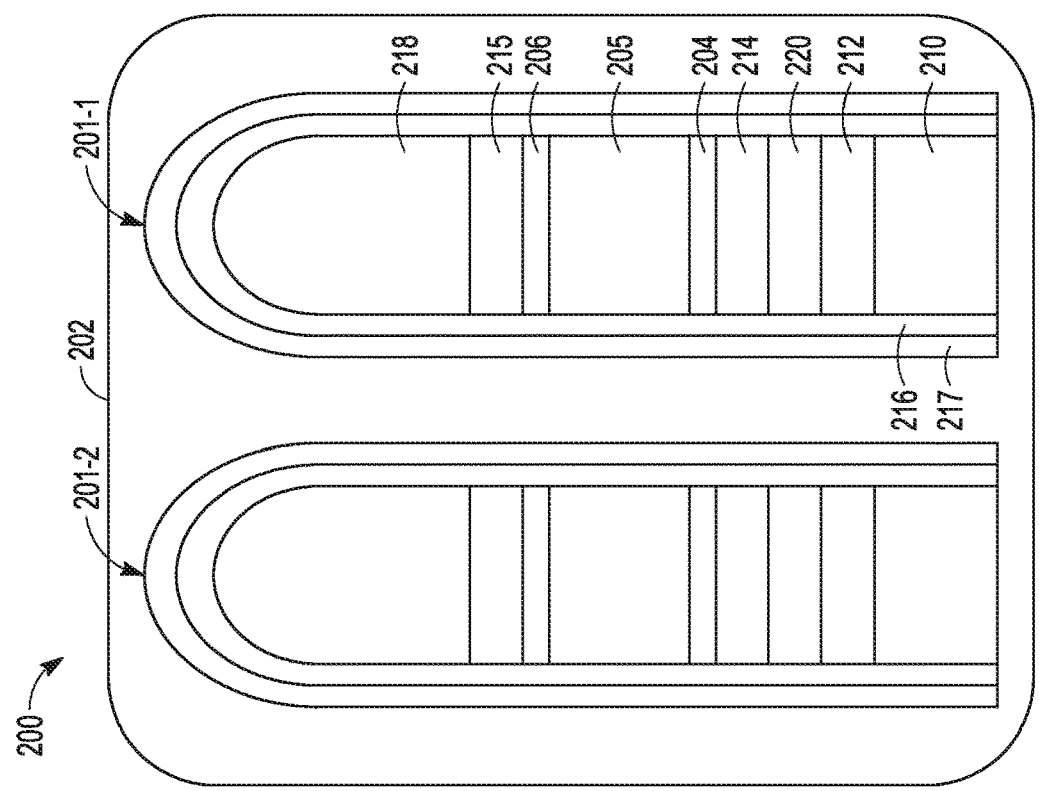
FIG. 2 is a representation of portions of two stacks in a 3D X-Point device with the two stacks separated and covered by dielectric gap fill, according to various embodiments.

FIG. 2 is a representation 200 of portions of two stacks, 201-1 and 201-2, in a 3D X-Point device with the two stacks 201-1 and 201-2 separated and covered by dielectric gap fill 202. Each of the stacks are structured in the same manner. The dielectric gap fill 202 can be a PLAD cured SOD. A number of SODs can be used including, but is not limited to, a SOG. The dielectric gap fill 202 can be used for array trenches in the 3D X-Point device. Stack 201-1, and hence stack 201-2, can include further sections stacked on the portions shown in FIG. 2.

Stack 201-1, and hence stack 201-2, is one type of stack including a PM region 205 and a selector device (SD) 220. Stack 201-1 can be arranged vertically with an access line 210, such as a wordline, on bottom with a bottom electrode 212 on the access line 210, the SD 220 on the bottom electrode 212, and a middle electrode 214 on the SD 220. PM region 205 is arranged above the middle electrode 214 and separated from the middle electrode 214 by a lamina region 204. The PM can be a chalcogenide-based PM. Another lamina region 206 can be disposed on the PM region 205 with a top electrode 215 disposed on lamina region 206. A hard mask (HM) 218 can be optionally be disposed above top electrode 215, where the HM 218 can typically be silicon nitride. Stack 201-1 can include a first sealing region 216 and a second sealing region 217. The bottom, middle, and top electrodes can be implemented using different electrode materials or the same material. Electrode material can include, but is not limited to, carbon. The laminas 204 and 206 can include tungsten. The first sealing region 216 can be silicon nitride 216 and the second sealing region 217 can be a silicon nitride. Other dielectric sealing materials can be used.

Figure 3:
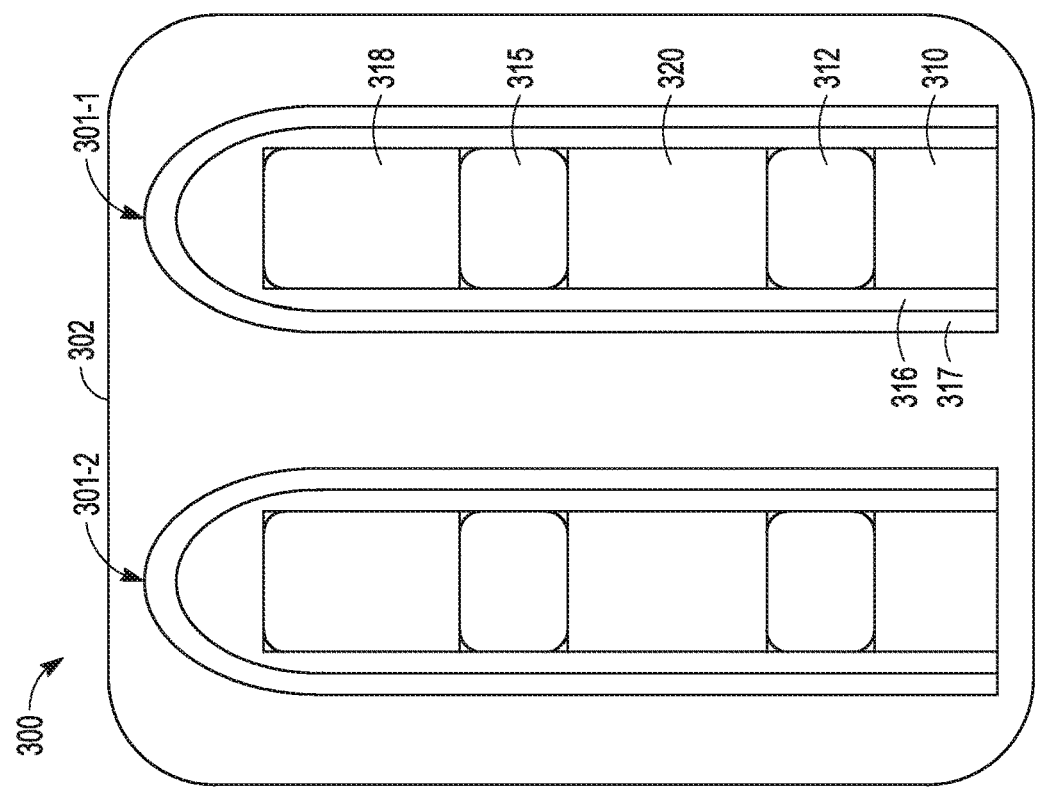
FIG. 3 is another representation of portions of two stacks in a 3D X-Point device with the two stacks separated and covered by dielectric gap fill, according to various embodiments.

FIG. 3 is a representation 300 of portions of two stacks, 301-1 and 301-2, in a 3D X-Point device with the two stacks 301-1 and 301-2 separated and covered by dielectric gap fill 302. Each of the stacks are structured in the same manner.

The dielectric gap fill 302 can be a PLAD cured SOD. A number of SODs can be used including, but is not limited to, a SOG. The dielectric gap fill 302 can be used for array trenches in the 3D X-Point device. Stack 301-1, and hence stack 301-2, can include further sections stacked on the portions shown in FIG. 3.

Stack 301-1, and hence stack 301-2, is one type of stack including a SD 320 without a PM region in the stack. Stack 301-1 can be arranged vertically with an access line 310, such as a wordline, on bottom with a bottom electrode 312 on the access line 310, the SD 320 on the bottom electrode 312, and a top electrode 315 on the SD 320. A HM 318 can be optionally be disposed on top electrode 315, where the HM 318 can typically be silicon nitride. Stack 301-1 can include a first sealing region 316 and a second sealing region 317. The bottom and top electrodes can be implemented using different electrode materials or the same material. Electrode material can include, such is but not limited to, carbon The first sealing region 316 can be silicon nitride 316 and the second sealing region 317 can be a silicon nitride. Other dielectric sealing materials can be used.

Figure 4:
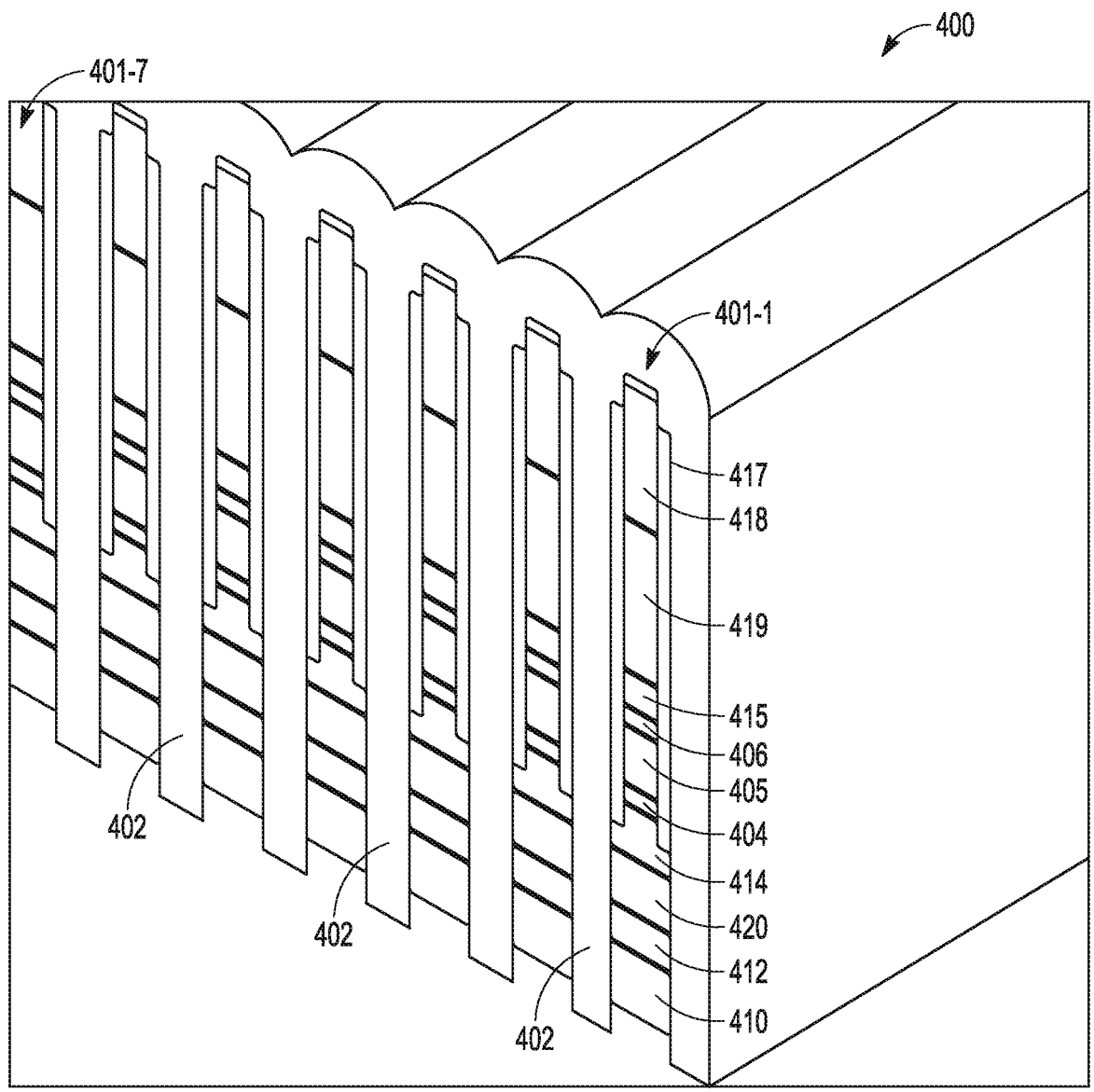
FIG. 4 is a representation of portions of multiple stacks in a 3D X-Point device with the multiple stacks separated from each other and covered by a dielectric gap fill, according to various embodiments.

FIG. 4 is a representation 400 of portions of multiple stacks, 401-1 . . . 401-7 in a 3D X-Point device with the multiple stacks separated from each other and covered by dielectric gap fill 402. Each of the stacks are structured in the same manner. The dielectric gap fill 402 can be a PLAD cured SOD. A number of SODs can be used including, but is not limited to, a SOD. The dielectric gap fill 402 can be used for array trenches in the 3D X-Point device. Though seven stacks are shown, the 3D X-Point device can have more or less than seven stacks.

Stack 401-1, and hence the other stacks of the 3D X-Point device, can be structured similar to stack 201-1 of FIG. 2. Stack 401-1 includes a PM region 405 and a SD 420. Stack 401-1 can be arranged vertically with an access line 410, such as a wordline, on bottom with a bottom electrode 412 on the access line 410, the SD 420 on the bottom electrode 412, and a middle electrode 414 on the SD 420. The PM region 405 is arranged above the middle electrode 414 and separated from the middle electrode 414 by a lamina region 404. The PM region 405 can be a chalcogenide-based PM. Another lamina region 406 can be disposed on the PM region 405 with a top electrode 415 disposed on lamina region 406. A HM, structured as regions 419 and 418, can be optionally be disposed above top electrode 415, where the HM can typically be silicon nitride. Stack 201-1 can include a sealing region 417. The bottom, middle, and top electrodes can be implemented using different electrode materials or the same material. Electrode material can include, such is but not limited to, carbon. The laminas 404 and 406 can include tungsten. The sealing region 417 can be nitride region. Other dielectric sealing materials can be used.

Though FIGS. 1-4 are used to demonstrate implementation of a PLAD cured SOD as a dielectric gap fill in 3D X-Point devices, PLAD cured SODs can be implemented as a dielectric providing electrical isolation in a number of other electronic devices. For example, PLAD cured SODs can be used in DRAM memories and NAND-type memories. In a 3D memory array of a DRAM device, a low-k SOD can be used to provide electrical isolation. In a NAND-type memory array, a PLAD cured SOD can be realized as a SOG disposed in a region having a high aspect ratio. In a NAND-type memory array, a PLAD cured SOD can be realized as a SOG disposed in a region having a low aspect ratio. Low aspect ratio structures have a height to width (h/w) ratio less than 10/1 and high aspect ratio structures have a h/w ratio greater than 10/1. For use in DRAM devices, NAND-type memory devices, and other electronic devices, a PLAD cured SOD other than a PLAD cured SOG can be used, for example, a PLAD cured carbon-rich SOD.

Figure 5:
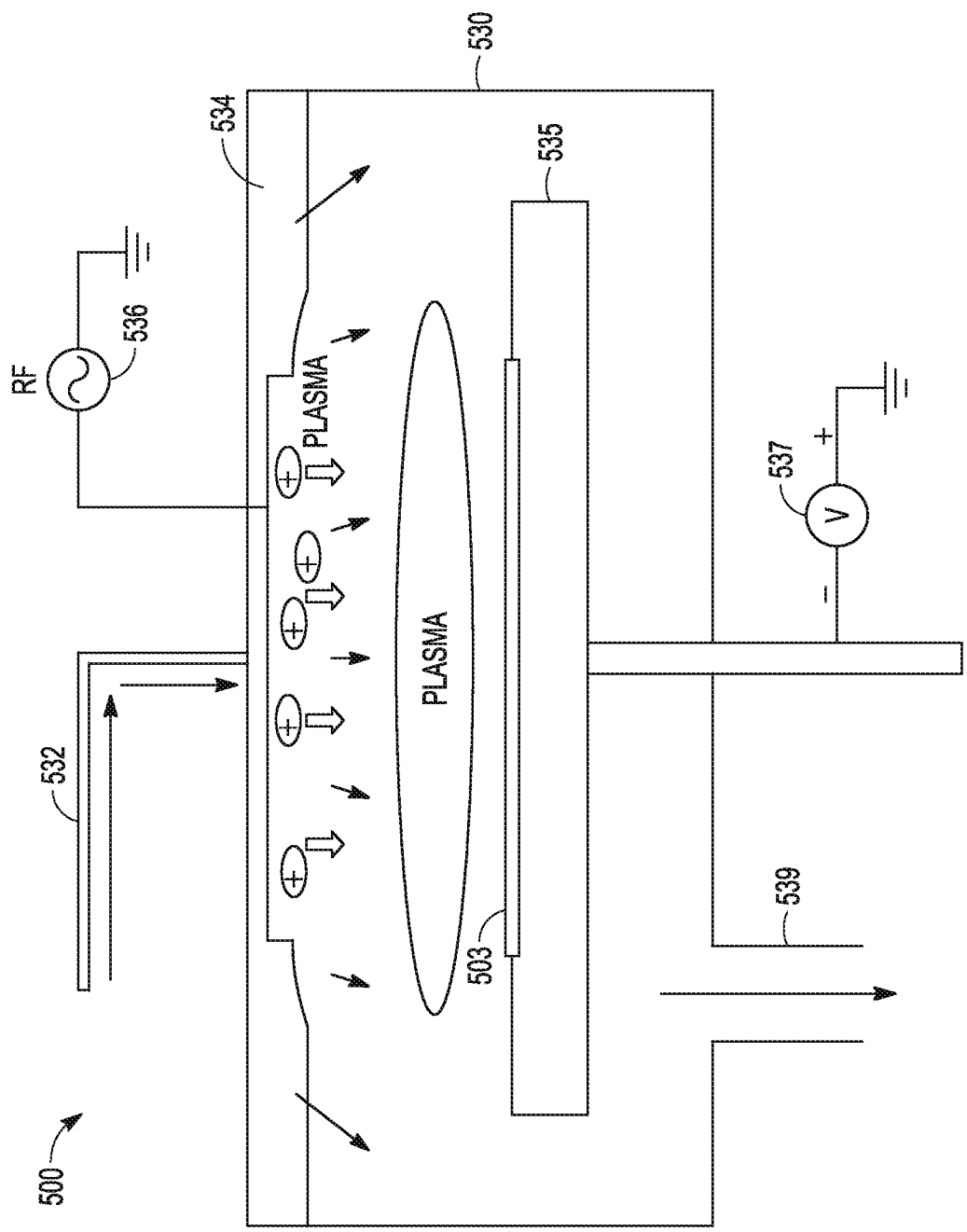
FIG. 5 is a representation of an apparatus for plasma doping of a wafer, according to various embodiments.

FIG. 5 is a representation of an apparatus 500 for plasma doping of a wafer 503. The apparatus 500 includes a chamber 530 having a shower head 534 coupled to a gas line 532. Precursors flow through the gas line 532 and shower head 534 into the chamber 530. The apparatus 500 includes a radio frequency (RF) generator 536 to form a plasma 538 above the wafer 503 mounted on a platform, which can be constructed as a heater 535. The heater can be coupled to a negative potential source 537. Excess gases from processing can be pumped out of the chamber 530 through an exhaust or exit port 539.

When the RF generator 536, which is coupled to the shower head 534, turns on, RF power ionizes dopant gas flowing through the shower head 534 from the gas line 532. Positive ions are attracted to the negative potential provided by the negative potential source 537 and accelerated towards the wafer 503. RF signals are used to dissociate dopant molecules, which are ionized in the plasma. These ions are accelerated by the negative bias potential provided by the negative potential source 537. The RF generator 536 can provide pulsed plasma doping in a PLAD process. This type of doping can provide for high-dose, low energy doping, which can be used for ultra-shallow junctions, such as dose of $10^{16}$ $cm^{-2}$ or greater levels and implant energy less than 500 eV. A full wafer can be doped in one step as opposed to beam-line ion implantation. The PLAD process can provide conformal doping for 3D structures, as a non-line-of-sight process, applicable to various structures, such as but not limited to, deep trench sidewalls and FinFet structures. Apparatus 500 can be used for PLAD curing of SOD materials in a wide variety of electronic devices.

In various embodiments, a SOD can be cured using PLAD with He as the dopant ion, which is referred to as a He PLAD. He PLAD can be implanted in a number of different formats with respect to one or more of dose, implant energy, pressure, temperature, and exposure time. Consider He PLAD radiations under different situations. A low pressure of 4 mTorr, which is a pressure for a conventional best known method, can provide radiation from soft-X ray to EUV with a violet-bluish color of plasma. A high pressure of 10 mTorr, that is 2.5 times higher than 4 mTorr, can provide far infrared (IR) radiation with a reddish color of plasma. A low energy of 100 eV, which is 80 times lower as compared a conventional best known method energy of operation of 8 KeV, can favor a "radiation dominated" process. Combination of PLAD and radiation provided by the use of He can be varied in a PLAD energy range between 8 KeV and 100 eV, to find an optimized process condition. He II provides a photon energy of 40.81 eV, which is in the soft-X Ray range, and He I provides a photon energy of 21.22 eV (He I), which is in the EUV range.

Low-dose implantation of energetic light ions such as $H^+$ and $He^+$ ions can be used for improving cross-linking, forming Si—O—Si linkage, of organoslioxanes for improved mechanical strengths. The implanted ions cause homolytic bond fission, allowing —Si—O—Si— cross-link formation. Homolytic bond fission is a chemical bond dissociation of a molecule in which each of the fragments retains one of the originally bonded electrons. It is expected that the use of a lighter ion, such as $H^+$ and $He^+$, the stronger is the effect. It is noted that, in contrast, oxygen-based plasma has been seen to be damaging to C-SOD and in some cases can remove most of the carbon from a SOD by oxidation. Such oxidative conditions were also seen to be damaging to a chalcogenide memory cell and sealing dielectric layers. Use of oxygen-based plasma also makes C-SOD more porous such that it would act as a reservoir of etch contaminates, post-CMP slurry particles, or aqueous solutions.

FIG. 6 shows a table 640 of experimental results of curing a C-SOD using conventional approaches and different PLAD approaches. The furnace only process did not use an implant tool or implant species. Processes that used beam-line implanted are identified with BL as the implant tool. The implant species is defined by type of dopant, implant energy, and dose. For example, F8k3E15 of line 7 for a beam-line implant tool is implant species of fluoride at an implant energy of 8 KeV with a dose of 3E15. Group 642 are He PLAD results, which are clearly the best results of the groups with respect to hardness and Young's modulus. The PLAD process can be extended to Ge, B, C, F, and other dopants.

FIG. 7 shows a table 740 of experimental results of curing a C-SOD using conventional approaches and different PLAD approaches. UV BKM refers to best known method for UV treatment. The values of hardness and Young's modulus are averaged across approximately 250 nm, and the values in the brackets are at the surface within 20 nm. The dry etching rate is at a PMME layer. A high energy (8 KeV) He PLAD can make a C-SOD too hard such that the etch rate is approximately 0, and also with degraded electrical property. Low energy (E) and very low energy (VLE), which can be defined as between 1 KeV and 250 eV, He PLAD processes showed most improvements. Note that ultra low energy is defined as 250 eV and lower. These improvements include better near surface hardness orYoung's modulus properties, better electrical property, reduced etch rate, and acceptable volume shrinkage. These improvements compared to furnace only and UV treatment can provide better near surface mechanical strength to improve CMP and dry etch issues, and maintain the bulk region with good chemical or thermal stabilities.

FIG. 8 shows a table 840 of density profiles from X-ray reflectometry (XRR) measurements on SiOC SODs. Such measurements provide information for tuning a SOD. Tuning can be performed by selecting parameters from a set of parameters for PLAD curing of the SOD. Tuning by using a selected set of parameter can be based on surface modification versus bulk modification of a SOD film associated with different sets of parameters. In table 840, G1 through G7 are sets of parameters for He PLAD, where each set includes parameters of implant energy, dose, time, and pressure. In the table 840. POR means process of record and p is density. The region of the SOD from 0 to 1 nm from the vertical end of the SOD above and opposite a substrate is a surface region, the region from 1 to 4 nm from the vertical end is a near surface region, and beyond 4 nm from the vertical end is a bulk region of the SOD.

He PLAD using either set G1 or set G2 results in the bulk of the SiOC being densified by the He PLAD at the parameters of the respective set. He PLAD using parameters of any of the sets G4, G5, G6, and G7 results in the surface of the SiOC being densified by the He PLAD for the respective set with the bulk remaining in a non-densified status. He PLAD using the parameters of set G3 is a borderline result between the two groups of sets.

Figure 9C:
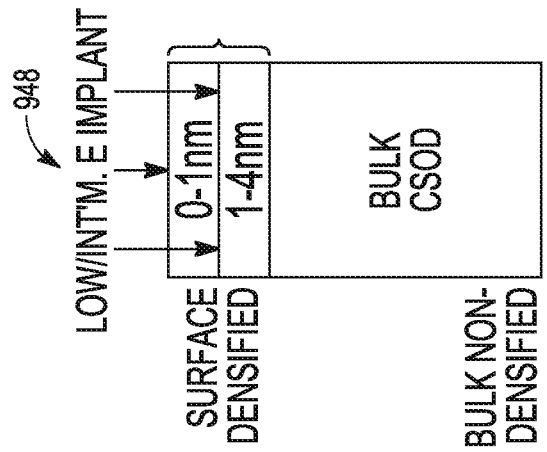
FIGS. 9A-9C show three situations associated with a set of parameters for PLAD of C-SODs, according to various embodiments.
Figure 9B:
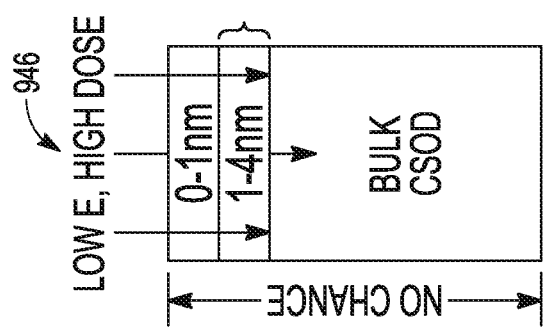
Figure 9A:
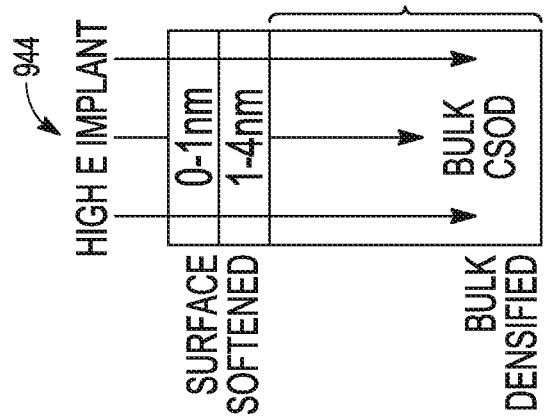

FIGS. 9A-9C show three situations associated with a set of parameters for PLAD of C-SODs such as shown in table 840 of FIG. 8. FIG. 9A shows a high energy implant 944 with the surface region (0-1 nm) and the near surface region (1-4 nm) softened with the bulk region densified. FIG. 9B shows a low energy, high dose implant 946 with the surface region (0-1 nm), the near surface region (1-4 nm), and the bulk region effectively experiencing no change. FIG. 9C shows a low and intermediate energy implant 948 with the surface region (0-1 nm) and the near surface region (1-4 nm) densified with the bulk region non-densified.

Figure 10:
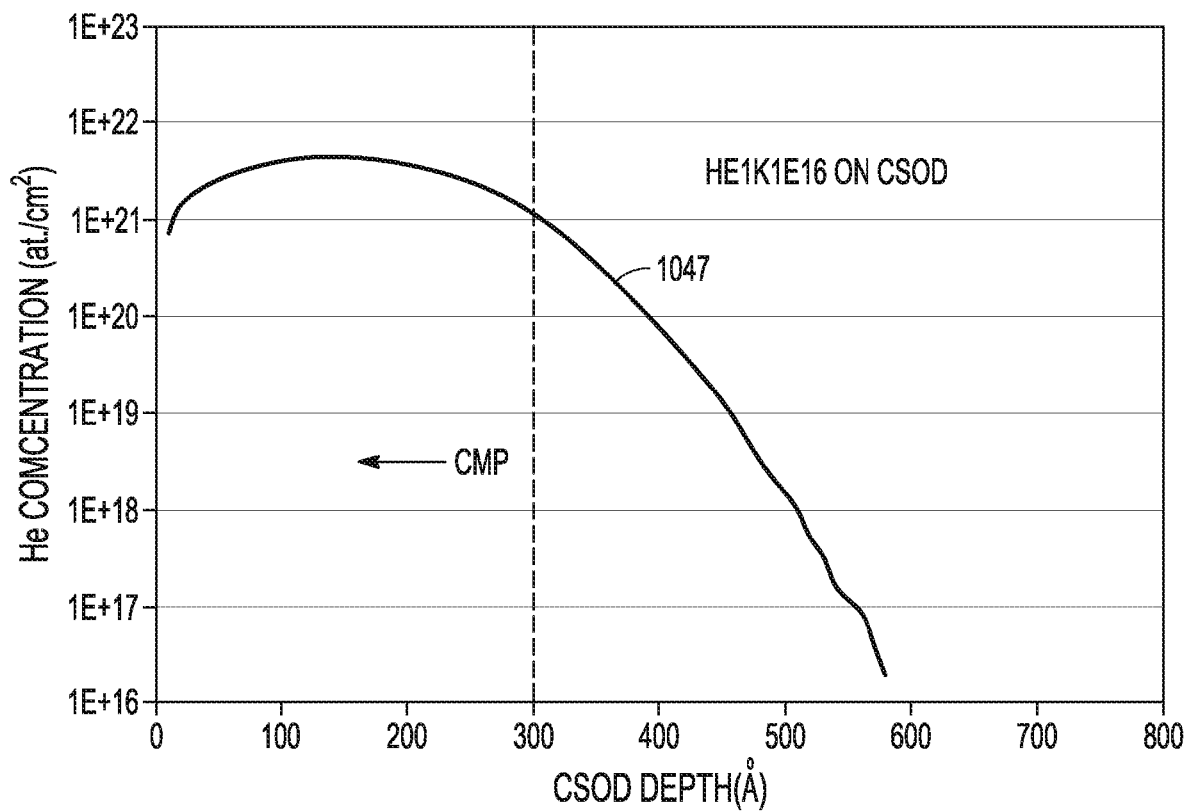
FIG. 10 shows a stopping and range of ions in matter (SRIM) simulation of a He concentration profile, according to various embodiments.

FIG. 10 shows a stopping and range of ions in matter (SRIM) simulation of a He concentration profile. A curve 1047 shows He concentration versus depth for a C-SOD with a surface region for CMP. A set of parameters, also referred to as a recipe, of the He PLAD of the C-SOD used in the simulation was He dopant species, at an implant energy of 1 KeV for a dose of 1E16, which recipe is written as HE1K1E16 in FIG. 10. In addition. He concentration measurements by secondary-ion mass spectrometry (SIMS) and nuclear reaction analysis (NRA) can be directly conducted on a wafer level of the final products, and can be totally non-destructive. Non-destructive process includes no cross-sectional process, no assembly process, and no sample preparation. After 300 Å are removed (for example by post-CMP or directed energy beam (DEB)). He concentration can be as high as $1E21/cm^3$ and detectable by SIMS measurement. According to a X-Point process flow, the top surface of He-PLAD processed C-SOD region can be removed by approximately 200 to 300 Å by CMP planarization.

Figure 11:
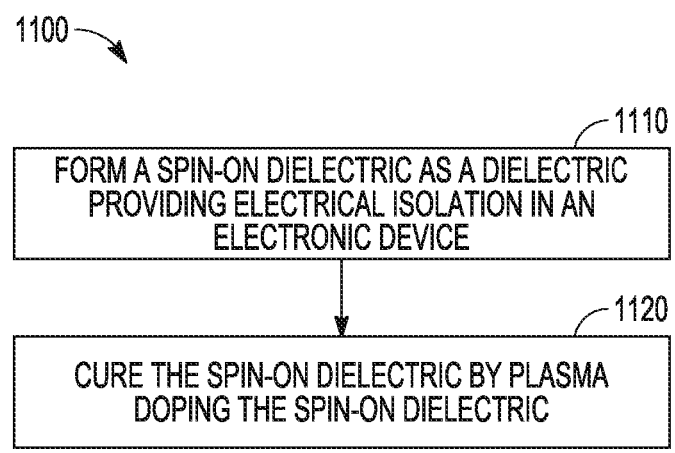
FIG. 11 is a flow diagram of features of an example method of preparing a dielectric film in an electronic device, according to various embodiments.

FIG. 11 is a flow diagram of features of an embodiment of an example method 1100 of preparing a dielectric film in an electronic device. At 1110, a spin-on dielectric is formed as a dielectric providing electrical isolation in an electronic device. The spin-on dielectric can be formed as one of a number of different materials. The spin-on dielectric can be provided as a spin-on glass. The spin-on dielectric can be a spin-on dielectric containing carbon. The spin-on dielectric can be a carbon-rich spin-on dielectric. The spin-on dielectric can include, but is not limited to, one or more of a organic spin-on dielectric, a organic SOD with varying carbon content, by atomic percent, from approximately 10% to 60%, and a photo-imageable SOD.

At 1120, in fabricating the electronic device, the spin-on dielectric is cured by plasma doping the spin-on dielectric. The PLAD process can be implemented as a non-oxygen PLAD process. The PLAD process can be implemented using one or more dopant species. The PLAD can be implemented with the dopant being a non-oxygen dopant. The PLAD can include doping with helium. The PLAD can include, but is not limited to, doping with one or more of hydrogen, nitrogen, boron, diborane, fluoride, boron trifluoride, carbon, and germanium. The PLAD can include using a dopant providing a photon energy greater than 10 eV.

Variations of the method 1100 or methods similar to the method 1100 can include a number of different embodiments that may be combined depending on the application of such methods or the architecture or process flow of an integrated circuit for which such methods are implemented. Such methods can include selectively modifying a physical property of the spin-on dielectric, by applying an implant energy and an implant dosage at levels selected from a relationship of implant energy or an implant dosage to length of the spin-on dielectric. Selectively modifying the spin-on dielectric for dielectric gap fill by tuning the implant energy and the implant dosage can allow Si—O—Si cross-linked structure formation. Modification of a physical property of the SOD can include modification of one or more of a thermal property, an optical property, a chemical property, an electrical property, and a mechanical property. Selectively modifying the spin-on dielectric can include modifying a surface region of the spin-on dielectric relative to a bulk region of the spin-on dielectric or modifying a bulk region of the spin-on dielectric relative to a surface region of the spin-on dielectric. Modifying the spin-on dielectric can include densifying the surface region while the bulk region remains non-densified or softening the surface region while densifying the bulk region. Optical properties such as, but not limited to, refractive index and absorption coefficient can be modified along a length of the spin-on dielectric. Selectively modifying the spin-on dielectric can include using an implant energy ranging from 100 eV to 10 KeV. In addition, carbon-less SOD or inorganic SOD with a dielectric constant in the range from about 5.6 to about 7.6 can be used for densification by PLAD curing.

Variations of the method 1100 or methods similar to the method 1100 can include, after curing, subjecting the spin-on dielectric to a chemical mechanical polishing (CMP) process. After the curing, the spin-on dielectric can have a Young's modulus, provided by the curing, that exceeds 10 GPa for performing the CMP. After curing, the spin-on dielectric can be subjected to dry etching.

Figure 12:
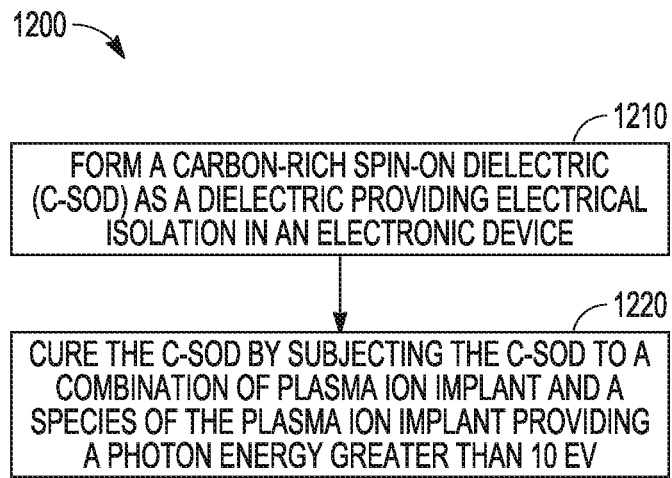
FIG. 12 is a flow diagram of features of an embodiment of an example method of preparing a dielectric film in an electronic device, according to various embodiments.

FIG. 12 is a flow diagram of features of an embodiment of an example method 1200 of preparing a dielectric film in an electronic device. At 1210, a carbon-rich spin-on dielectric (C-SOD) is formed as a dielectric providing electrical isolation in an electronic device. The C-SOD can be a photo definable UV sensitive gap fill. A UV sensitive gap fill is a material is sensitive to UV light, such as but not limited to photoresist materials. At 1220, the C-SOD is cured by subjecting the C-SOD to a combination of plasma ion implant and a species of the plasma ion implant providing a photon energy greater than 10 eV. Selected ion implant dose for a species and implant energy can be selected to provide mechanical strength such as film harding and Young's modulus assisting integration of the film in the electronic device. The species can include one or more of helium, hydrogen, nitrogen, boron, diborane, fluoride, boron trifluoride, carbon, and germanium.

Variations of the method 1200 or methods similar to the method 1200 can include a number of different embodiments that may be combined depending on the application of such methods and/or the architecture or process flow of an integrated circuit for which such methods are implemented. Such methods can include subjecting the C-SOD to the combination of the plasma ion implant and the species of the plasma ion implant for a minute or less than a minute. The C-SOD can be subjected the combination of the plasma ion implant and the species of the plasma ion implant at room temperature.

Variations of the method 1200 or methods similar to the method 1200 can include selectively modifying a physical property of the C-SOD, by applying an implant energy and an implant dosage at levels selected from a relationship of implant energy or an implant dosage to length of the C-SOD. The physical property of the C-SOD can include modification of one or more of a thermal property, an optical property, a chemical property, an electrical property, and a mechanical property. Selectively modifying the C-SOD can include densifying the surface region while the bulk region remains non-densified or softening the surface region while densifying the bulk region. The physical property can include an optical property of the C-SOD modified along a length of the C-SOD.

In various embodiments, a memory device can comprise a three-dimensional memory array and dielectric films in the memory array providing electrical isolation, where the dielectric films include a spin-on dielectric (SOD) as a dielectric between stacks of memory cells of the memory array, with the SOD including carbon and plasma-implanted ions. The SOD including carbon and plasma-implanted ions can be realized by a number of different material compositions. For example, the SOD can be a carbon-rich SOD. The plasma-implanted ions can include, but are not limited to, one or more of helium, hydrogen, nitrogen, boron, diborane, fluoride, boron trifluoride, carbon, and germanium.

Variations such memory devices can include a number of different embodiments that may be combined depending on the application of such memory devices or the architecture of the memory devices. Such memory devices can include the SOD having a physical property that varies vertically along the SOD. The physical property that varies can be density. Other physical properties of the SOD that can vary are one or more of a thermal property, an optical property, a chemical property, an electrical property, and a mechanical property. Further, the SOD can have a porosity in a range from about 10% to about 50% with pore size between about 0.6 nm and 0.7 nm.

Variations such memory devices can include the three-dimensional memory array structured as a chalcogenide-based phase-change memory array. The three-dimensional memory array structures can include OTS selector devices in stacks between an access lines and a data lines. In the three-dimensional memory array structures, the SOD including carbon and plasma-implanted ions can have a tuned thermal conductivity between array cells with a balanced thermal barrier among the nearest neighbor cells, provided by PLAD curing. The three-dimensional memory array can be a DRAM memory array and the SOD can be a low-k SOD. The three-dimensional memory array can be a NAND-type memory array in which the SOD is disposed in a region having a high aspect ratio. The three-dimensional memory array can be a NAND-type memory array in which the SOD is disposed in a region having a low aspect ratio.

Figure 13:
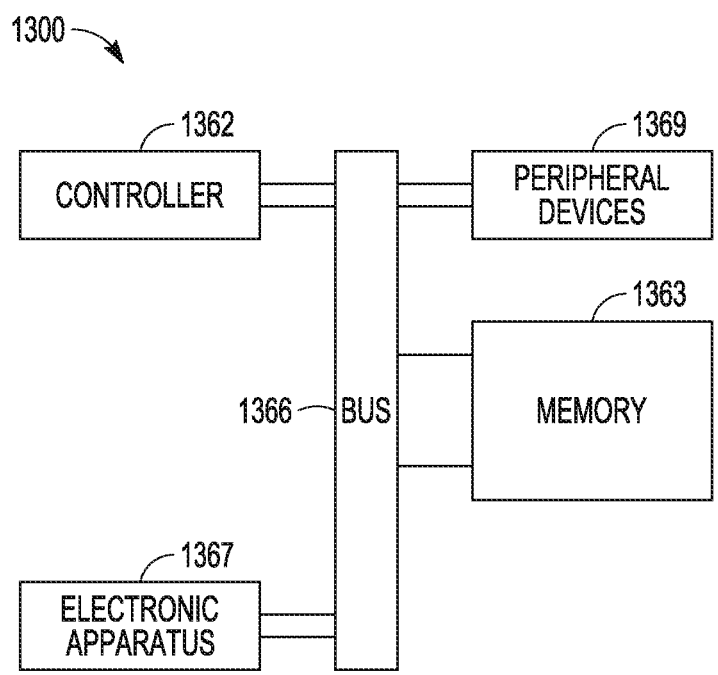
FIG. 13 shows a block diagram of an example system that includes a memory structured with a three-dimensional memory array such that dielectric films in the memory array include a PLAD cured SOD, according to various embodiments.

FIG. 13 shows a block diagram of an embodiment of an example system 1300 that includes a memory 1363 structured with a three-dimensional memory array such that dielectric films in the memory array, providing electrical isolation, include a SOD as a dielectric between stacks of memory cells of the memory array. The SOD can be structured to include carbon and plasma-implanted ions from PLAD curing of the SOD. The PLAD cured SOD can be realized in accordance with various embodiments discussed herein.

The system 1300 can include a controller 1362 operatively coupled to the memory 1363. The system 1300 can also include an electronic apparatus 1367 and peripheral devices 1369. One or more of the controller 1362, the memory 1363, the electronic apparatus 1367, or the peripheral devices 1369 can be in the form of one or more ICs.

A bus 1366 provides electrical conductivity between and/or among various components of the system 1300. In an embodiment, the bus 1366 can include an address bus, a data bus, and a control bus, each independently configured. In an alternative embodiment, the bus 1366 can use common conductive lines for providing one or more of address, data, or control, the use of which is regulated by the controller 1362. The bus 1366 can be operable as a network communication structure. The controller 1362 can be in the form or one or more processors.

The electronic apparatus 1367 may include additional memory. Memory in the system 1300 may be constructed as one or more types of memory such as, but not limited to, X-Point memory devices, NAND memory devices, DRAMs, static random access memory (SRAM), synchronous dynamic random access memory (SDRAM), synchronous graphics random access memory (SGRAM), double data rate dynamic ram (DDR), double data rate SDRAM, magnetic based memory, and other types of memory.

The peripheral devices 1369 may include displays, imaging devices, printing devices, wireless devices, additional storage memory, and control devices that may operate in conjunction with the controller 1362. In various embodiments, the system 1300 includes, but is not limited to, fiber optic systems or devices, electro-optic systems or devices, optical systems or devices, imaging systems or devices, and information handling systems or devices such as wireless devices, wireless systems or devices, telecommunication systems or devices, and computers.

The following are example embodiments of systems and methods, in accordance with the teachings herein.

An example method 1 can comprise: forming a spin-on dielectric as a dielectric providing electrical isolation in an electronic device; and curing the spin-on dielectric by plasma doping (PLAD) the spin-on dielectric.

An example method 2 can include features of example method 1 and can include the spin-on dielectric being a spin-on glass.

An example method 3 can include features of any of the preceding example methods and can include selectively modifying a physical property of the spin-on dielectric, by applying an implant energy and an implant dosage at levels selected from a relationship of implant energy or an implant dosage to length of the spin-on dielectric.

An example method 4 can include features of example method 3 and any of the preceding example methods and can include selectively modifying the spin-on dielectric including modifying a surface region of the spin-on dielectric relative to a bulk region of the spin-on dielectric or modifying a bulk region of the spin-on dielectric relative to a surface region of the spin-on dielectric.

An example method 5 can include features of example method 4 and any of the preceding example methods and can include modifying the spin-on dielectric including densifying the surface region while the bulk region remains non-densified or softening the surface region while densifying the bulk region.

An example method 6 can include features of example method 3 and any of the preceding example methods and can include selectively modifying the spin-on dielectric including using an implant energy ranging from 100 eV to 10 KeV.

An example method 7 can include features of any of the preceding example methods and can include the PLAD including using a dopant providing a photon energy greater than 10 eV.

An example method 8 can include features of any of the preceding example methods and can include the PLAD including doping with helium.

An example method 9 can include features of any of the preceding example methods and can include the PLAD including doping with one or more of hydrogen, nitrogen, boron, diborane, fluoride, boron trifluoride, carbon, and germanium.

An example method 10 can include features of any of the preceding example methods and can include the spin-on dielectric including one or more of a organic spin-on dielectric with varying carbon content, by atomic percent, from approximately 10% to 60% and photo-imageable spin-on dielectric.

An example method 11 can include features of any of the preceding example methods and can include, after curing, subjecting the spin-on dielectric to a chemical mechanical polishing (CMP) process.

An example method 12 can include features of claim 11 and any of the preceding example methods and can include, after curing, the spin-on dielectric having a Young's modulus, provided by the curing, that exceeds 10 GPa for performing the CMP.

An example method 13 can include features of any of the preceding example methods and can include, after curing, subjecting the spin-on dielectric to dry etching.

An example method 14 can comprise: forming a carbon-rich spin-on dielectric (C-SOD) as a dielectric providing electrical isolation in an electronic device; and curing the C-SOD by subjecting the C-SOD to a combination of plasma ion implant and a species of the plasma ion implant providing a photon energy greater than 10 eV.

An example method 15 can include features of claim 14 and can include subjecting the C-SOD to the combination for a minute or less than a minute.

An example method 16 can include features of any of claims 14 and 15 and can include subjecting the C-SOD to the combination at room temperature.

An example method 17 can include features of any of the preceding example methods 14-16 and can include selectively modifying a physical property of the C-SOD, by applying an implant energy and an implant dosage at levels selected from a relationship of implant energy or an implant dosage to length of the C-SOD.

An example method 18 can include features of claim 17 and any of the preceding example methods 14-16 and can include selectively modifying the C-SOD to include densifying the surface region while the bulk region remains non-densified or softening the surface region while densifying the bulk region.

An example method 19 can include features of claim 17 and any of the preceding example methods 14-16 and 18 and can include the physical property to include an optical property of the C-SOD modified along a length of the C-SOD.

An example method 20 can include features of any of the preceding example methods 14-19 and can include the species to include one or more of helium, hydrogen, nitrogen, boron, diborane, fluoride, boron trifluoride, carbon, and germanium.

An example memory device 1 can comprise: a three-dimensional memory array; and dielectric films in the memory array providing electrical isolation, the dielectric films including a spin-on dielectric (SOD) as a dielectric between stacks of memory cells of the memory array, with the SOD including carbon and plasma-implanted ions.

An example memory device 2 can include features of example memory device 1 and can include the SOD being a carbon-rich SOD.

An example memory device 3 can include features of any of the preceding example memory devices and can include the SOD having a physical property that varies vertically along the SOD.

An example memory device 4 can include features of example memory device 3 and any of the preceding example memory devices and can include the physical property being density.

An example memory device 5 can include features of any of the preceding example memory devices and can include the plasma-implanted ions including one or more of helium, hydrogen, nitrogen, boron, diborane, fluoride, boron trifluoride, carbon, and germanium.

An example memory device 6 can include features of any of the preceding example memory devices and can include the three-dimensional memory array being a chalcogenide-based phase-change memory array.

An example memory device 7 can include features of any of the preceding example memory devices and can include the three-dimensional memory array being a dynamic random-access memory (DRAM) memory array and the SOD is a low-k SOD.

An example memory device 8 can include features of any of the preceding example memory devices and can include the three-dimensional memory array being a NAND-type memory array in which the SOD is disposed in a region having a high aspect ratio.

An example memory device 9 can include features of any of the preceding example memory devices and can include the three-dimensional memory array being a NAND-type memory array in which the SOD is disposed in a region having a low aspect ratio.

An example memory device 10 can include features of any of the preceding example memory devices and can include the SOD having a porosity in a range from about 10% to about 50% with pore size between about 0.6 nm and 0.7 nm.

In an example memory device 11, any of the memory devices of example memory devices 1 to 10 may include memory devices incorporated into an electronic system further comprising a host processor and a communication bus extending between the host processor and the memory device.

In an example memory device 12, any of the memory devices of example memory devices 1 to 11 may be modified to include any structure presented in another example memory device 1 to 11.

In an example memory device 13, any of apparatus of any of the memory devices of example memory devices 1 to 12 may further include a machine-readable storage device configured to store instructions as a physical state, wherein the instructions may be used to perform one or more operations of the apparatus.

In an example memory device 14, any of the example memory devices 1 to 13 may be adapted and operated to perform operations in accordance with any of the methods of the following example methods 1 to 20.

Low-dose implantation of energetic light ions, such as H$^+$, He$^+$, and others, as taught herein, can be used to improve cross-linking of organoslioxanes for improved mechanical strengths. The cross-linking can include forming Si—O—Si linkage. Such techniques using He PLAD processes can provide increase in hardness by greater than a factor of 22, and increase in Young's modulus by greater than a factor of 10. Implanted ions cause homolytic bond fission, allowing —Si—O—Si— cross-link formation and, thus, enhancement of mechanical properties. These increased mechanical properties include hardness, Young's modulus, increase and densification. The lighter the ion used, the stronger is the effect.

Curing by PLAD of SOD region can be used to selectively densify either the surface or bulk of gap fill films by tuning the ion dose and energy. The tuning can be provided by selecting the PLAD process parameters, such as implant energy and ion dose, that match the desired density modification of the SOD region. In addition to density modification, other physical properties of the SOD region can be modified along a length of the SOD region.

He PLAD process is a high throughput, low cost, low temperature treatment that can be used to cure C-SOD films by mechanisms of a combination of high energy radiation and plasma ion implant. He and species other He can be used in curing SODs in structures in forming electronic devices, where the structures can have across a wide variety of aspect ratios, depths, and functions.

In addition. PLAD curing is not limited to one particular type of SOD (for example C-SOD), but also applicable to any other SOD or SOG materials and polymers used in STI gap fill. Other SOD materials can include organic SOD with varying carbon content, by atomic percent, from approximately 10% to 60% and photo-imageable SOD, and other others. As a result of applicable to a range of SOD materials and structures, PLAD curing is applicable to 3D X-Point memory devices. DRAM devices including using low-k SOD fill. NAND memories including NAND devices with large area gap fill films, and other electronic devices.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. Combinations of the above embodiments and other embodiments will be apparent to those of skill in the art upon studying the above description.

What is claimed is:

1. A method comprising:
   forming a spin-on dielectric as a dielectric providing electrical isolation in an electronic device;
   curing the spin-on dielectric by directly plasma doping (PLAD) the spin-on dielectric using helium as a dopant; and
   modifying multiple properties of the spin-on dielectric as a function of length of the spin-on dielectric by tuning a dopant dose, a bias implant energy, pressure, and a plasma exposure time, the multiple properties including one or more of a thermal property, a chemical property, or an electrical property.

2. The method of claim 1, wherein the spin-on dielectric is a spin-on glass.

3. The method of claim 1, wherein the method includes curing the spin-on dielectric at room temperature.

4. The method of claim 1, wherein the modifying the spin-on dielectric includes modifying a surface region of the spin-on dielectric relative to a bulk region of the spin-on dielectric or modifying a bulk region of the spin-on dielectric relative to a surface region of the spin-on dielectric.

5. The method of claim 4, wherein the modifying the spin-on dielectric includes densifying the surface region while the bulk region remains non-densified or softening the surface region while densifying the bulk region.

6. The method of claim 1, wherein the modifying the spin-on dielectric includes using an implant energy ranging from 100 eV to 10 KeV.

7. The method of claim 1, wherein the PLAD includes using a dopant providing a photon energy greater than 10 eV.

8. The method of claim 1, wherein the PLAD includes doping with helium providing soft x-ray radiation to process the spin-on dielectric in curing the spin-on dielectric.

9. The method of claim 1, wherein the PLAD includes plasma doping with one or more of nitrogen, boron, diborane, fluoride, boron trifluoride, carbon, or germanium.

10. The method of claim 1, wherein the spin-on dielectric includes one or more of an organic spin-on dielectric with varying carbon content, by atomic percent, from approximately 10% to 60% or photo-imageable spin-on dielectric.

11. The method of claim 1, wherein the method includes, after curing, subjecting the spin-on dielectric to a chemical mechanical polishing (CMP) process.

12. The method of claim 1, wherein the modifying multiple properties of the spin-on dielectric includes modifying an optical property of the spin-on dielectric.

13. The method of claim 1, wherein the method includes, after curing, subjecting the spin-on dielectric to dry etching.

14. The method of claim 1, wherein the spin-on dielectric is formed and PLAD cured filling a memory array gap between columns of stacked memory cells in a memory device.

15. The method of claim 1, wherein the PLAD is a non-oxygen PLAD process and includes doping with one or more of boron, diborane, fluoride, boron trifluoride, carbon, or germanium.

16. The method of claim 1, wherein the modifying multiple properties of the spin-on dielectric as a function of length of the spin-on dielectric includes modifying an electrical property.

17. The method of claim 1, wherein the plasma doping the spin-on dielectric includes plasma doping the spin-on dielectric at a selected pressure to provide a selected radiation.

18. The method of claim 1, wherein the bias implant energy is greater than 1 KeV and less than 8 KeV.

19. A method comprising:
  forming a carbon-rich spin-on dielectric (C-SOD) as a dielectric providing electrical isolation in an electronic device;
  curing the C-SOD by directly subjecting the C-SOD to a combination of plasma ion implant and a species, including using helium as a dopant, of the plasma ion implant providing a photon energy greater than 20 eV in curing the C-SOD; and
  modifying multiple properties of the C-SOD as a function of length of the C-SOD by tuning a dose of the plasma ion implant, a bias implant energy, pressure, and a plasma exposure time, the multiple properties including one or more of a thermal property, a chemical property, or an electrical property.

20. The method of claim 19, wherein the subjecting the C-SOD to the combination includes subjecting the C-SOD to the combination for a minute or less than a minute.

21. The method of claim 19, wherein the modifying multiple properties of the spin-on dielectric includes modifying an absorption coefficient along the length of the spin-on dielectric.

22. The method of claim 19, wherein the method includes forming the C-SOD in a three dimensional cross-point memory device.

23. The method of claim 19, wherein the modifying the C-SOD includes densifying a surface region of the C-SOD while a bulk region of the C-SOD remains non-densified or softening the surface region while densifying the bulk region.

24. The method of claim 19, wherein the modifying multiple properties of the spin-on dielectric includes modifying an optical property of the C-SOD modified along a length of the C-SOD.

25. The method of claim 19, wherein the species includes one or more of nitrogen, boron, diborane, fluoride, boron trifluoride, carbon, or germanium.

26. The method of claim 19, wherein the C-SOD is formed and cured directly by the combination of plasma ion implant and the species of the plasma ion implant filling a memory array gap between columns of stacked memory cells in a memory device.

27. The method of claim 19, wherein the formed C-SOD includes $SiO_x$, with x>1, plus approximately 50% carbon plus pores.

28. The method of claim 19, wherein the C-SOD includes a photo definable UV sensitive gap fill.

29. The method of claim 19, wherein the method includes curing the spin-on dielectric at room temperature.

30. The method of claim 19, wherein the bias implant energy is between 1 KeV and 250 eV.

* * * * *